(12) United States Patent
Yokozawa (10) Patent No.: US 7,683,302 B2
(45) Date of Patent: Mar. 23, 2010

(54) SOLID-STATE IMAGING DEVICE HAVING ON-CHIP COLOR FILTER LAYERS AND SOLID-STATE IMAGING DEVICE MANUFACTURING METHOD OF THE SOLID-STATE IMAGING DEVICE

(75) Inventor: Kenji Yokozawa, Otsu (JP)

(73) Assignee: Panasonic Corporation, Osaka (JP)

( * ) Notice: Subject to any disclaimer, the term of this patent is extended or adjusted under 35 U.S.C. 154(b) by 1203 days.

(21) Appl. No.: 11/243,979

(22) Filed: Oct. 6, 2005

(65) Prior Publication Data

US 2006/0077268 A1    Apr. 13, 2006

(30) Foreign Application Priority Data

Oct. 8, 2004    (JP) ............................. 2004-296672

(51) Int. Cl.
*H01L 27/14* (2006.01)
(52) U.S. Cl. ............. 250/208.1; 250/214.1; 250/214 R; 257/432; 438/70
(58) Field of Classification Search ............. 250/208.1, 250/216, 214.1, 214 R; 257/432; 438/70
See application file for complete search history.

(56) References Cited

U.S. PATENT DOCUMENTS

| 4,667,092 | A  |   | 5/1987 | Ishihara |           |
|-----------|----|---|--------|----------|-----------|
| 5,239,172 | A  | * | 8/1993 | Yokota et al. | ............ 250/208.1 |
| 5,404,005 | A  | * | 4/1995 | Shimomura et al. | ...... 250/208.1 |
| 5,747,790 | A  | * | 5/1998 | Shimomura et al. | ...... 250/208.1 |
| 6,255,640 | B1 | * | 7/2001 | Endo et al. | ............... 250/208.1 |
| 7,474,350 | B2 | * | 1/2009 | Shimizu et al. | ............. 348/340 |

FOREIGN PATENT DOCUMENTS

| JP | 59-122193 | 7/1984 |
|----|-----------|--------|
| JP | 11-337715 | 12/1999 |

* cited by examiner

*Primary Examiner*—Seung C Sohn
(74) *Attorney, Agent, or Firm*—Wenderoth, Lind & Ponack, L.L.P.

(57) ABSTRACT

A solid-state imaging device 1 includes: a semiconductor substrate 11 on which pixels are placed like a matrix; and each of the pixels having a photoelectric conversion element 13 and a color filter layer 21 which is formed on the photoelectric conversion element 13. The solid-state imaging device 1 includes resin parts 20 which are formed at the boundaries of these photoelectric conversion devices 13 which are adjacent to each other, each of the resin parts 20 having an upward convex shape. Each color filter layer 21 of the device is formed so that the color filter layer covers the area ranging from the summit of a resin part to the summit of an adjacent resin part, and each color filter layer 21 is thinner in the peripheral part than in the center part around the summit.

14 Claims, 6 Drawing Sheets

SOLID-STATE IMAGING DEVICE HAVING ON-CHIP COLOR FILTER LAYERS AND SOLID-STATE IMAGING DEVICE MANUFACTURING METHOD OF THE SOLID-STATE IMAGING DEVICE

BACKGROUND OF THE INVENTION (1) Field of the Invention

The present invention relates to a solid-state imaging device having on-chip color filter layers and a manufacturing method of the solid-state imaging device.

(2) Description of the Related Art

With the advancement of a color image forming technique, recent years have seen a remarkable growth in the use of a single-board color type solid-state imaging device, the use being for a digital still camera mainly including CCD (Charge Coupled Device) type, and a mobile phone with a camera mainly including CMOS type. This leads to the increase in the demands for downsizing such a solid-state imaging device having on-chip color filters and the day-by-day increase in the number of pixels. However, in order to meet such demands for the solid-state imaging device like this, the light-receiving area of a photoelectric conversion element 13, which is a light-receiving sensor, must be downsized. This is becoming a cause for deteriorating photoelectric conversion characteristics (light sensitivity) which are a primal characteristic of a solid-state imaging device.

For example, main optical sizes of solid-state imaging devices to be mounted on digital still camera ranges from a third inch to a fourth inch, and further downsizing to a sixth inch or to below a sixth inch is being considered. Also, the number of pixels is becoming greater up to the range from 2M pixels to 5M pixels, and it is considered to increase the number exceeding 5M pixels. Therefore, there emerges a need to establish a technique for maintaining the primal characteristics of a solid-state imaging device such as light sensitivity, color mixture between adjacent pixels and nonuniform tone of lines even in the case of downsizing a light-receiving area and increasing the number of pixels.

Here will be provided detailed description of this. Increasing the number of pixels without downsizing the pixel size causes the increase in the chip size, resulting in making the size of a solid-state imaging device larger. This means that the downsizing of the pixel size must be performed in parallel. In general, downsizing the pixel size leads to downsizing a photoelectric conversion element 13 represented by a photodiode, resulting in the deterioration in light sensitivity. In order to improve light sensitivity, a number of countermeasures have been taken. Especially, there have been proposed a number of structures, manufacturing methods and the like concerning a microlens which is formed on such a pixel.

Also, downsizing the pixel size becomes a cause for deteriorating not only light sensitivity but also various color characteristics stemming from a color filter layer. In general, making the pixel size finer causes deterioration in the dimensional accuracy of a color filter, resulting in the deterioration in characteristics such as color mixture between pixel filters which are adjacent to each other, nonuniform tone of lines, and sensitivity variations between pixel filters.

Therefore, the importance of on-chip color filter layers in a solid-state imaging device is increasingly becoming greater, and thus there is a demand for establishing a technique with which the deterioration of the characteristics such as color mixture, nonuniform tone of lines and sensitivity variations can be prevented.

Figure 1:
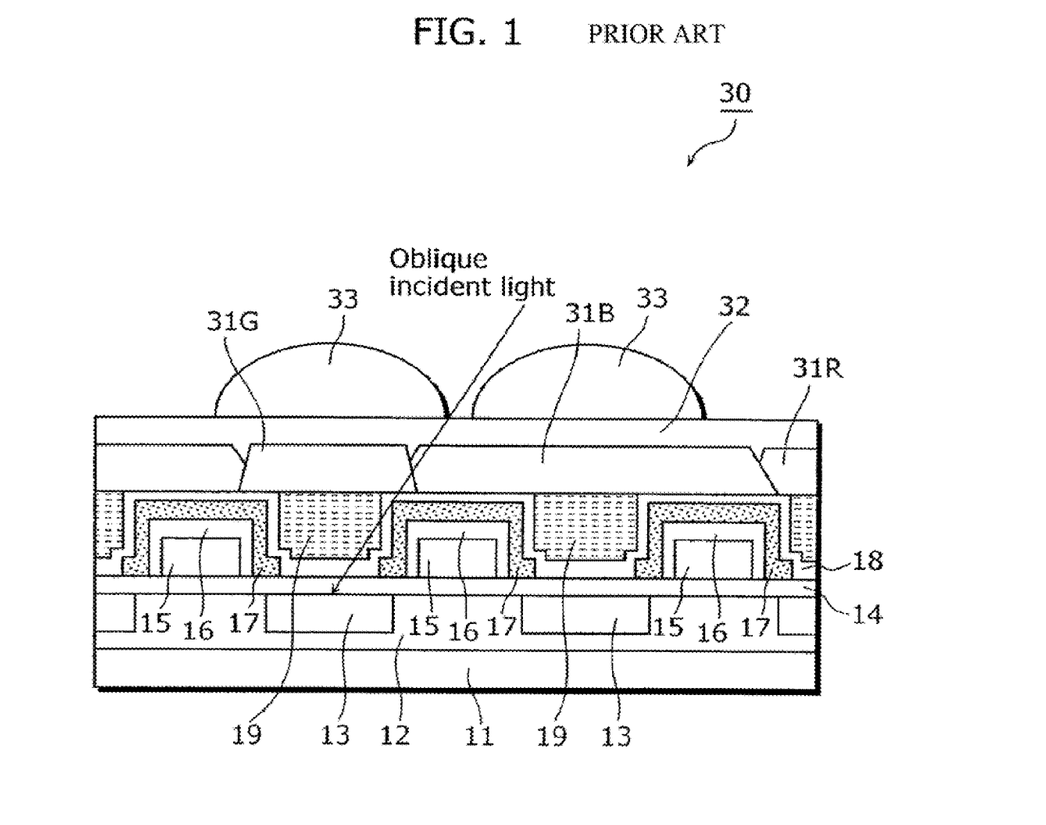
FIG. 1 is a sectional view of a conventional solid-state imaging device having color filter layers which are made of pigment dispersion type color resists.
Figure 2:
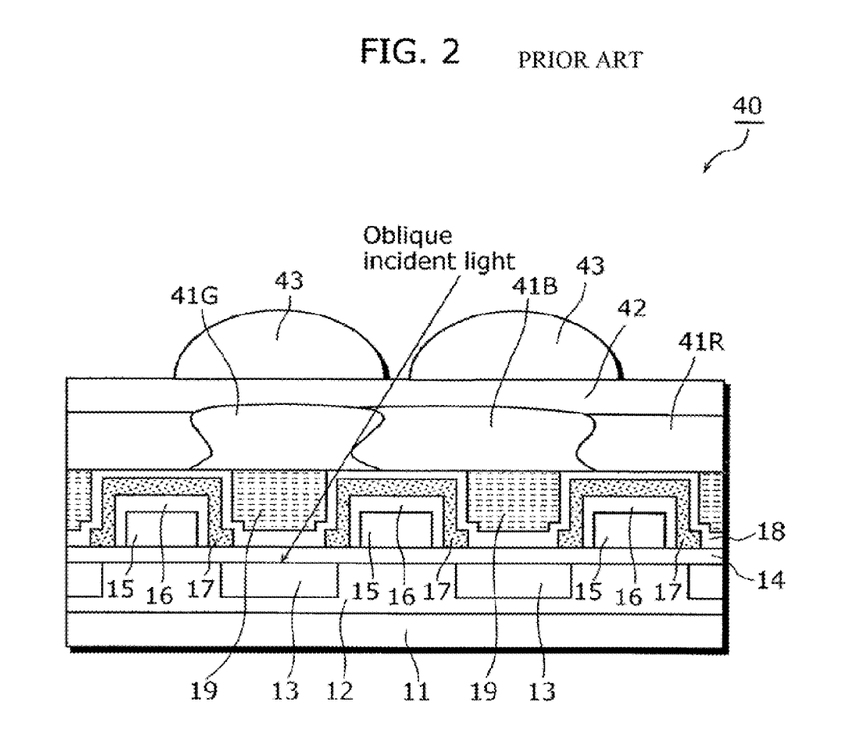
FIG. 2 is a sectional view of a conventional solid-state imaging device having color filter layers which are made of dye-containing type color resists.
Figure 3:
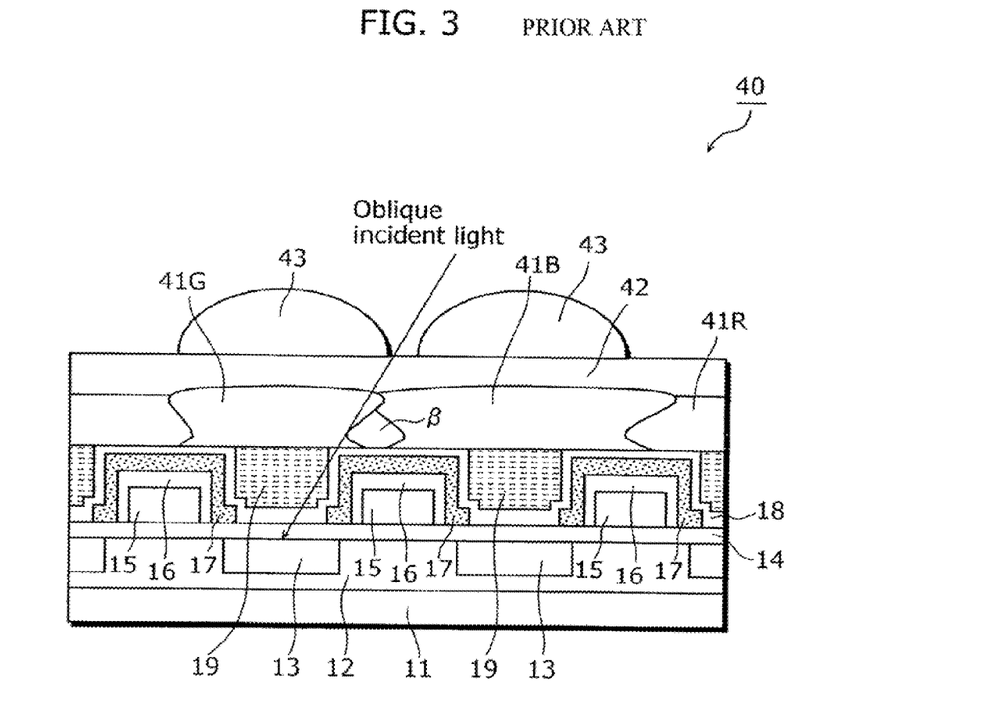
FIG. 3 is a sectional view of another conventional solid-state imaging device having color filter layers which are made of dye-containing type color resists.

FIG. 1 to FIG. 3 each depicts a sectional view of a pixel of a conventional solid-state imaging device.

These solid-state imaging devices 30 and 40 are each formed in the following way: forming a P-type semiconductor well region 12, which becomes second electric conductive type, on a semiconductor substrate 11 which is made of a first electric conductive type (for example, N type) silicon semiconductor; and then forming an N-type semiconductor region on the P-type semiconductor well region 12, a N-type semiconductor region and a P-type semiconductor well region 12 constitute a photoelectric conversion element 13. The respective photoelectric conversion elements 13 are formed in array shapes and arranged in a matrix form.

Further, on the boundaries of photoelectric conversion elements 13, for example, a conversion electrode 15 which is made of polycrystalline silicon is formed through the gate insulation film 14. On the conversion electrode 15 an inter-layer insulation film 16 which covers this conversion electrode 15 is formed. Also, on the rest of the whole surface, in other words, on the inter-layer insulation film 16 excluding the apertures of the photoelectric conversion elements 13, for example, a light-shielding film 17 which is made of AL, W and the like is formed. After that, the light-shielding film 17 and the gate insulation film 14 are covered with a surface protection film 18.

Further, a first transparent planarization film 19 is filled with each concave part above a photoelectric conversion element 13. After that, in the case of a solid-state imaging device 30, color filter layers 31G, 31B and 31R are respectively formed on each photoelectric conversion element 13. In contrast, in the case of a solid-state imaging device 40, color filter layers 41G, 41B and 41R are respectively formed on each photoelectric conversion element 13. In both the cases, a second transparent planarization film 42 is formed on the color filter layers 31G, 31B and 31R, and also the color filter layers 41G, 41B and 41R, and on-chip microlenses 43 are formed on the second transparent planarization film 42, the on-chip microlenses 43 collecting incident light to the respectively corresponding photoelectric conversion elements 13.

The first transparent planarization film 19 is for forming stable color filter layers 31 and 41 and for making the ground flat. The second transparent planarization film 32 is for planarizing the color filter layers 31 and 41 as the ground layer so as to form on-chip microlenses 43 accurately.

Such color filter layers 31 and 41 are made of one of the following two types of color filter layers: primary color filter layers which are made of red, green and blue filters; and complementary color filter layers which are made of yellow, cyan and magenta filters.

Also, the material used for the color filter layers 31 is pigment dispersion type and has excellent light-resistance and heat resistance. A representative of such a material is a mixture of: pigments; a dispersion agent; a photosensitive material; a resin; and the like. Color filter layers 31 are formed, according to a color resist method for obtaining a desired type of color filters, by performing a selective exposure process and a development process of a photo-resist film containing such a material. In this way, the solid-state imaging device 30 can provide the following two countermeasures for realizing high-definition against downsizing of pixels: slimming down a pigment filter which realizes improvement in the dimensional accuracy of color filter layers, and preventing nonuniform tone of lines, sensitivity variations and color mixture between color filter layers which are adjacent to each other; and making pigment particles finer. By means of the above-listed countermeasures, a color S/N ratio is being improved.

Also, the material which is used for the color filter layers 41 is made of a pigmented dye instead of a pigment and the like. The color filter layers 41 are formed, according to a color resist method for forming desired color filters, by performing a selective exposure process and a development process of a photo-resist film containing a mixture of such materials. Recent years have seen an accelerated research and development on this material, as a dye-containing color-resist which does not contain a fine particle, which can replace a pigment-dispersion color-resist. Some of such color-resists become commercially practical, in other words, some of them have been used for color filter layers of solid-state imaging devices (Refer to Reference Document 1: Japanese Laid-Open Patent Application No. 11-337715.).

The improvement example disclosed in the Patent Document 1 is for concurrently simplifying a manufacturing process and improving light-resistance and heat-resistance by means of making dyes into pigmented dyes in order to obtain desired spectral characteristics.

However, slimming down the pigment-dispersion filter used for a conventional solid-state imaging device 30 requires that a certain degree of film thickness be secured in order to obtain desired spectral characteristics, resulting in placing a restriction in slimming down. Further, making pigment particles finer involves a great difficulty, and it is impossible to prevent the diameter of secondary particles from increasing through re-aggregation even if those particles are once made finer. Further, since pigment particles are present as long as the pigment dispersion color filter layers 31 are employed, the problems which are caused depending on the dimensional accuracy of the color filter layers 31 have not yet been fundamentally solved, the problems being related to the color characteristics such as nonuniform tone of lines, color mixture, sensitivity variations and color S/N ratios.

This will be described below more specifically. The dimensional accuracy is improved because the following countermeasures concerning the pigment dispersion color filter layers 31 are taken: slimming down of a material which is used for a color filter (an increase in the pigment content); an improvement in resolution by means of such a material; and a countermeasure in the manufacturing process. However, there is a need to consider the influence of the particle size of a pigment which is used as a primal material of the color filter layers 31 in order to decrease the pixel size. Especially, since a pigment itself is considered to be a particle in dimensional accuracy and the secondary particle diameter is approximately 100 nm in general, great technical advancement is required to decrease the sizes of such particles down to 50 nm by taking a countermeasure of making such particles much finer. Also, whether or not desired spectrum characteristics can be obtained in the case of making particles finer has not yet been sufficiently confirmed. Further, since pigments are particles, it is inevitable that the taken image looks uneven and the color S/N ratios (signal to noise ratio) deteriorate even in the case where such a countermeasure of making pigment particles finer is taken. Therefore, assumingly, an existing technique places a limit to the use of such a pigment dispersion color resist which has a finer particle for color filter layers 31 in a solid-state imaging device.

In other words, it is difficult for us to cause a conventional solid-state imaging device 30 to prevent the deterioration in light sensitivity or color mixture between adjacent pixels only by slimming down such color filter layers accompanied by the reduction in the pixel size. The cause of color mixture will be described below more specifically. Color mixture occurs depending on the sectional edge shapes of color filter layers. The edges of the color filters cannot be cut vertically when they are formed. For this reason, a firstly-formed color filter layer has a trapezoid shape (the top surface dimension is smaller than the bottom surface dimension). Since a secondly-formed and thirdly-formed color filter layers are inserted into the gaps of the firstly-formed color filter pattern, they also have a trapezoid shape, in other words, the top surface dimensions are smaller than the bottom surface dimensions). Consequently, an oblique incident light passes through the edge parts of the color filter layers of adjacent pixels as shown in FIG. 1. This makes it impossible to obtain desired spectral characteristics, resulting in causing color mixture.

Also, there is a problem which makes pigment particles finer decreases the alignment margin because of a conventional sectional shape. This is because, in the case where a gap in arrangement is generated, oblique incident light which passes through the edges of the color filter layers of adjacent pixels as shown in FIG. 1 causes color mixture, which makes it impossible to obtain desired spectral characteristics. Further, color mixture degree varies depending on the angle of oblique incident light, and there are other problems such as nonuniform tone of lines, flicker, color shading and sensitivity variations.

In the case of using the pigment type color filter layers 31, exposure light randomly reflects on the surface of pigment particles and thus the light reaches comparatively deeper part of the filter. In contrast, in the case of the solid-state imaging device 40 for which the dye-containing color filter layers 41 are employed in order to improve the color S/N ratios, light polymerization reaction advances only in the proximity of the surfaces, in other words, the non-reaction parts are dominant inside the filters because there is no random reflection on the surfaces of the dye-containing type color filter layers 41.

A thermal process which is generally referred to as Post Exposure Bake (PEB) is performed after exposure in order to accelerate such reaction inside the filters. At this time, performing this process under an appropriate temperature is very important. This is because it is impossible to complete development in the case where the process is performed under a too high temperature, and because cavities are generated on the sectional surfaces after development in the case where the process is performed under a too low temperature (Refer to FIG. 2). Therefore it is general that PEB conditions (temperature and time) are determined considering these problems. However, conventional technique is not sufficient to solve these problems even though it can slightly improve the problem of cavities which are generated on the sectional surfaces.

An example of such cavities is shown as cavity $\beta$ in FIG. 3. The cavity $\beta$ is generated at the boundary of the first layer and the second layer when the material to become the second layer is coated. Consequently, light is diffused making the problems worse, these problems being color mixture, nonuniform tone of lines and sensitivity variations. Further, the consequent thermal process causes the gas in the cavity $\beta$ to expand, which causes the deformation of the color filter layer 41, the transparent planarization film 42, and the microlens 43. This results in affecting the reliability of the device.

SUMMARY OF THE INVENTION

The present invention is conceived considering the above-described problems. A primary object of the present invention is to provide (a) a solid-state imaging device which can improve the problems such as color mixture, nonuniform tone of lines and sensitivity variations between color filter layers which are adjacent to each other and (b) a manufacturing method of the solid-state imaging device.

Also, a secondary object of the present invention is to provide (a) a solid-state imaging device which can further improve color S/N ratios resulting in improving its reliability and (b) a manufacturing method of the solid-state imaging device.

In order to achieve the primary object, in the solid-state imaging device concerning the present invention, in which pixels are arrayed like a matrix above a semiconductor substrate and each pixel has a photoelectric conversion element 13 and a color filter layer formed above the photoelectric conversion element 13, includes: resin parts formed above boundary parts between photoelectric conversion elements 13 which are adjacent to each other so that each resin part constitutes an upward convex part formed above each boundary part, and in the device, each color filter layer is formed so that the color filter layer covers the area ranging from the summit of a resin part to the summit of an adjacent resin part; and each color filter layer is formed so that the color filter layer is thinner in the peripheral part than in the center part around the summit.

This makes the edge shapes of the color filter layers vertical, and thus the color filter layers can be formed accurately. Consequently, the dimensional accuracy of these color filters is improved, and it becomes possible to prevent oblique incident light from causing color mixture in adjacent color filter layers and improve the following problems which are generated depending on dimensional accuracy: color mixture; non-uniform tone of lines; and sensitivity variations.

Also, compared to a conventional structure, the spectral dispersion becomes weaker in the peripheral parts of the color filter layers than in the center parts. Therefore, transparent light from the peripheral parts increases. Consequently, it is expected that the sensitivity of a solid-state imaging device is improved.

Note that color structure of a resin part may be a transparent film or a colored film (including black). Also, it is desirable that the width of the resin part be the same as or shallower than that of the boundary region. Also, it is desirable that the height of the resin part be lower than the surface of the center part of the color filter layer.

Also, in a second aspect of the present invention, in order to achieve the second object, in the solid-state imaging device concerning the present invention, each color filter layer is made of a dye-containing type color resist.

In this way, the resin part slims down the peripheral parts of the color filter layers even in the case where such color filter layers are made of dye-containing color resists. This advances the light polymerization reaction in such a manner that it covers the whole peripheral parts of the films, and thus cavities at the edges are improved. This can consequently prevent generation of cavities which is conventionally observed, and improves the problems of color mixture, non-uniform tone of lines and sensitivity variations, resulting in improving the reliability of the device. In addition, this makes it possible to make the surfaces of color filter layers become even although they are uneven in the case where dye-containing type color filters are used, and thus it becomes possible to improve the color S/N ratios.

Also, in the first aspect of the present invention, in the solid-state imaging device concerning the present invention, the resin parts may be formed like a lattice above the boundary parts between photoelectric conversion elements 13 which are adjacent to each other, and each color filter layer may function as a concave lens.

Since the resin part is formed in a form of matrix at the boundary between itself and the adjacent photoelectric conversion element 13, each color filter layer has a sectional shape which is more upsurged than the photoelectric conversion area. Also, it becomes a concave lens in the case of a high-definition pixel size. Consequently, it has an effect of effectively condensing incident light into the peripheral part of the surface to the photoelectric conversion elements 13 and improving its sensitivity. Further, it is expected that it has an effect of improving color shading caused by oblique light.

Also, in the first aspect of the present invention, in the solid-state imaging device concerning the present invention, each resin part may be made of a material having a refractive index which is lower than a refractive index of each color filter.

This provides an effect of reducing incident light coming from an adjacent pixel when oblique incident light reaches the peripheral part.

Also, in the first aspect of the present invention, the solid-state imaging device concerning the present invention may further include first transparent planarization films which are formed between each of the photoelectric conversion elements 13 and each of the color filter layers so that the surfaces of the first transparent planarization films become flush with the surfaces of the boundary parts, and in the device, each color filter layer may be made of a material having a refractive index which is higher than a refractive index of each first transparent planarization film.

This also provides an effect of reducing incident light coming from an adjacent pixel when oblique incident light reaches the peripheral part.

Also, in the fourth aspect of the present invention, the solid-state imaging device concerning the present invention may further include second transparent planarization films which are formed on the color filter layers, and in the device, each second transparent planarization film may be made of a material having a refractive index which is lower than the refractive index of each color filter layer.

This also provides an effect of reducing incident light coming from an adjacent pixel when oblique incident light reaches the peripheral part.

Also, in the sixth aspect of the present invention, the solid-state imaging device concerning the present invention may further include microlenses which are formed on said second transparent planarization films, and in the device, each microlens may be made of a material having a refractive index which is higher than the refractive index of each second transparent planarization film.

In this way, these color filter layers serve as a lens. Therefore, placing microlenses on those color filter layers can improve the light condensing efficiencies of the color filter layers, and thus it becomes possible to improve the sensitivity of the color filter layers.

Also, in the seventh aspect of the present invention, in the solid-state imaging device concerning the present invention, each microlens may be made of a material having a refractive index which is higher than the refractive index of each color filter layer.

With this structure, the double lens effect, which is provided by the combination of the color filter layer 21 which serves as a concave lens and the microlens 23 which serves as a convex lens, makes it possible to condense light gradually and efficiently. Thus it is expected that its sensitivity is improved.

Also, the manufacturing method of the solid-state imaging device concerning the present invention, in which pixels may be arrayed like a matrix above a semiconductor substrate and each pixel has a photoelectric conversion element 13 and a color filter layer formed above the photoelectric conversion element 13, includes: forming resin parts above boundary parts between photoelectric conversion elements 13 which are adjacent to each other so that each resin part constitutes an upward convex part formed above each boundary part; and forming each color filter layer which covers the area ranging from the summit of a resin part to the summit of an adjacent resin part so that the color filter layer is thinner in the peripheral part than in the center part around the summit.

Also, in the ninth aspect of the present invention, the manufacturing method of the solid-state imaging device concerning the present invention may further include: forming microlenses on the color filter layers, and in the forming of the resin parts in the method, the resin parts may be made of a mask for forming the microlenses.

Also, in the tenth aspect of the present invention, in the manufacturing method of the solid-state imaging device concerning the present invention, the resin parts may be made of a negative type resist, in contrast, the microlenses may be made of a positive type resist.

In this way, it becomes possible to form a resin part and a microlens only using a mask, and thus it is possible to lower the cost for manufacturing a solid-state imaging device.

As described up to this point, the solid-state imaging device concerning the present invention makes it possible to form respective filter layers accurately. This is because, by means of forming a resin part having an upwardly convex sectional shape crossing a boundary between adjacent color filter layers of the respective pixels, the boundary regions of the color filter layers formed in sequence are slimmed down. Consequently, adjacent color filter layers are not affected by each other when oblique incident light reaches them, and thus it becomes possible to improve the problems such as color mixture, nonuniform tone of lines, sensitivity variations and color shading.

Also, since the thickness of a combination part of the resin part and each color filter layer placed on the resin part becomes thicker, it becomes consequently possible to realize color filter layers which serve as a convex lens.

Also, since the sectional shape (edge shape) of each color filter layer is improved, the problem of cavities which are conventionally generated around the boundaries of the respective color filter layers is solved. In this way, it becomes possible to realize a highly-reliable solid-state imaging device having excellent color characteristics.

FURTHER INFORMATION ABOUT TECHNICAL BACKGROUND TO THIS APPLICATION

The disclosure of Japanese Patent Application No. 2004-296672 filed on Oct. 8, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 4:
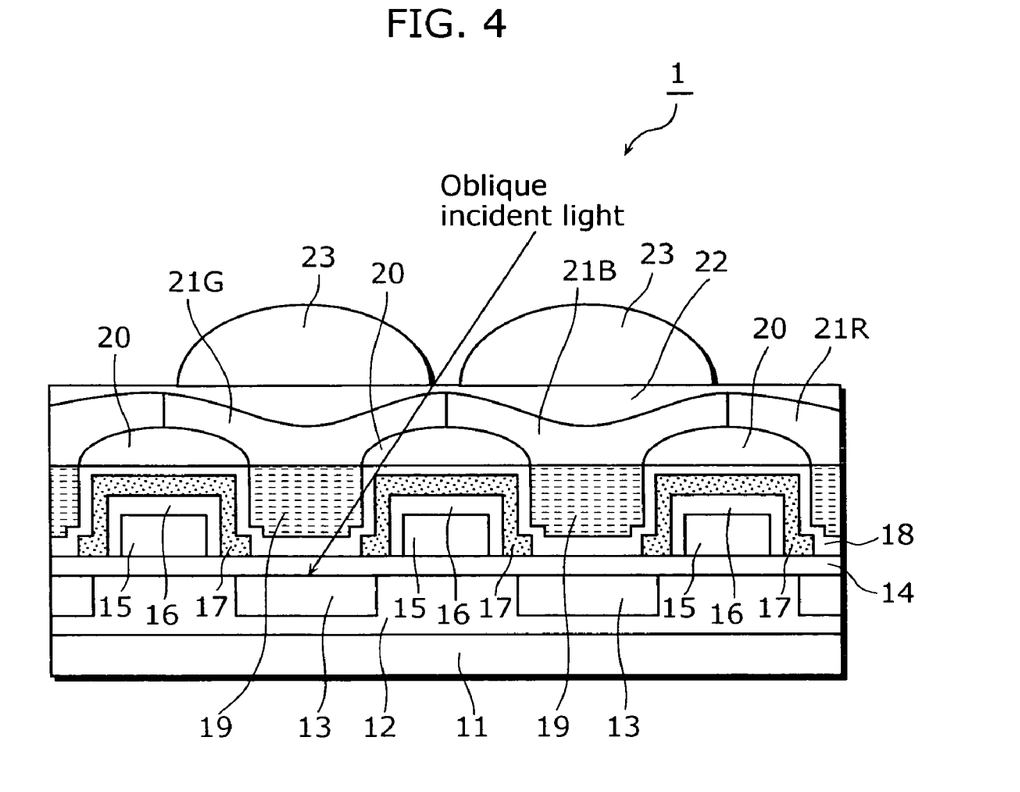
FIG. 4 is a diagram showing the sectional structure of a solid-state imaging device concerning the embodiment of the present invention.

FIG. 4 is a diagram showing the sectional structure of a solid-state imaging device concerning the embodiment of the present invention. Note that sectional views of two photoelectric conversion elements 13 are shown in the figure.

As shown in FIG. 4, this solid-state imaging device 1 includes: a first conductive type (for example, N-type) semiconductor substrate (N-type semiconductor substrate) 11; a second conductive type (for example, P-type) first semiconductor well (P-well layer) 12; photoelectric conversion elements 13; a gate insulation film 14; a conversion electrode 15; an inter-layer insulation film 16; a light-shielding film 17; a surface protection film 18; a first transparent planarization film 19; a resin part 20; a color filter layer 21; a second transparent planarization film 22 and a microlens 23.

On the surface of the N-type semiconductor substrate 11, the P-well layer 12 having inverse characteristics of the N-type semiconductor substrate 11 is formed. On the surface of the P-well layer 12 N-type semiconductor regions are formed, which forms a matrix of photoelectric conversion elements 13. On the surfaces of the P-well layer 12 and each photoelectric conversion element 13 the gate insulation film 14 is formed.

Further, on the gate insulation film 14 in the boundary region between photoelectric conversion elements 13, the conversion electrode 15 made of polycrystalline silicon is formed. On the surface of the conversion electrode 15 the inter-layer insulation film 16 is formed so that the inter-layer insulation film 16 covers the conversion electrode 15. On the inter-layer insulation film 16 the light-shielding film 17 made of, for example, tungsten is formed, the inter-layer insulation film 16 being formed on the gate insulation film 14 excluding the part above the apertures of photoelectric conversion elements 13. Further, on the surface of the light-shielding film 17 and the gate insulation film 14, the surface protection film 18 made of a SiON film and the like is formed. As the result, conversion electrodes 15 and the like are formed as convex parts on the respective photoelectric conversion elements 13.

In order to form the color filter layer 21 accurately later on, well-known processes of coat, exposure and development processes are performed using a transparent photosensitive film which is mainly made of a phenol resin and the like. Consequently, each concave part is filled with the surface protection film 19 so that the surface of the surface protection film 19 becomes flush with the highest surfaces of the surface protection films 18.

First, one of the following is coated: a negative type photosensitive acrylic resin (transparent resin) which is obtained by removing a pigment component or a dye component from the materials of the color filter layers 21; and a colored negative type photosensitive acrylic resin which is obtained by adding a black pigment or a black dye to this transparent resin. Next, exposure and development processes are performed using a mask which is designed to be narrower than the light-shielding film 17. In this way, each resin part 20 is formed on the surface protection film 18 which covers the light-shielding part 17 so that it becomes an upward convex part having a dimension narrower than the surface protection film 18.

After that, a first color filter layer 21G is formed by coating a first color filter layer material (for example, green), and performing exposure and development processes using a mask which is designed to form a color filer layer 21 at a desired position. Note that in the case of using a dye-containing type color resist as a material for a color filter layer 21, performing the PEB process after exposure makes it possible to improve the stability and the sectional shape of the color filter layer 21. After that, a second color filter layer 21B (for example, blue) and a third color filter layer 21R (for example, red) are formed in sequence. In other words, each of the color filters 21G, 21B and 21R is formed in a way that it covers the area ranging from the summit of a resin part 20 to the next summit of an adjacent resin part 20, and each of the color filters 21G, 21B and 21R is thicker in the top surface than the peripheral part. Consequently, those color filter layers 21G, 21B and 21R function as concave lenses respectively.

Further, in order to form each on-chip microlens 23 accurately later on, a second transparent planarization film 22 is formed by coating a transparent resin which is mainly made of acrylic resin several times, baking and then dry-etching the coated transparent resin using an etch-back method.

After forming the second transparent planarization film 22, the processes of coating, exposure and development of the transparent resin are performed to form each on-chip microlens 23.

In this way, with the resin part 20, later-formed color filter layers 21G, 21B and 21R are slimmed down in the boundaries between each other as compared to the part above the photoelectric conversion elements 13, making each of them function as a concave lens, and thus it becomes possible to improve the light condensing efficiency and the sensitivity of each filter. Further, it becomes possible to form color filters 21G, 21B and 21R accurately, which makes it possible to prevent color mixture between adjacent elements which occurs depending on a dimensional accuracy and to improve the problems of nonuniform tone of lines, sensitivity variations and color shading.

Note that the resin part 20 is made of a material having a refractive index lower than that of the color filter layer 21, the color filter layer 21 is made of a material having a refractive index higher than that of the transparent planarization film 19, the second transparent planarization film 22 is made of a material having a refractive index lower than that of the color filter layer 21, and the microlens 23 is made of a material having a refractive index higher than that of the color filter layer 21.

Therefore, this structure provides an effect of reducing incident light from an adjacent pixel when oblique incident light reaches the peripheral part. In addition to this, the lens effects provided by the color filter layer 21 and the microlens 23 enables to condense light gradually and efficiently, the color filter layer 21 serving as a concave lens and the microlens 23 serving as a convex lens. Thus it is expected that its sensitivity is improved.

Next, the manufacturing method of a solid-state imaging device 1 formed in this way will be described with reference to FIGS. 4, 5 and 6.

FIG. 4 is a sectional view of the solid-state imaging device of the present invention. FIGS. 5 and 6 each is a diagram showing the sectional view of the solid-state imaging device, the section view illustrating the order of the manufacturing processes of the solid-state imaging device.

Figure 5:
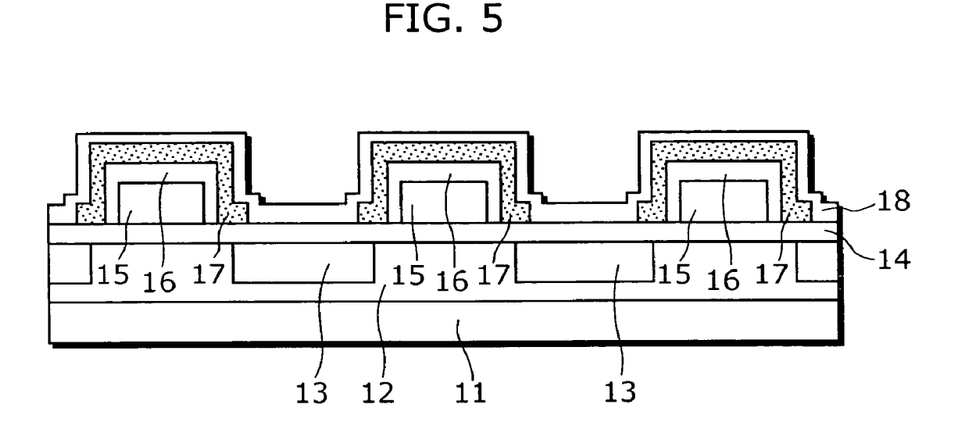
FIG. 5 is a sectional view of the solid-state imaging device of the present invention in its manufacturing process until a surface protection film 18 is formed on the N-type semiconductor substrate 11.

FIG. 5 is a sectional view of the solid-state imaging device of the present invention in its manufacturing process until a surface protection film 18 is formed on the N-type semiconductor substrate 11

The manufacturing method illustrated by the figure will be described below with reference to the following (1) to (4).

(1) First, P-well layers 12 having inverse characteristics of the N-type semiconductor substrate 11 are formed like a matrix on the surface of the N-type semiconductor substrate 11 so as to form an N-type dispersion layer (photoelectric conversion element) 13 on each of these P-well layers 12. In general, the P-well layer 12 and the N-type dispersion layer (photoelectric conversion element) 13 are formed by repeating the photolithographic process, the ion implantation process, and the thermal dispersion process.

(2) After the photoelectric conversion elements 13 are formed, a gate insulation film 14 is formed on the surfaces of the P-well layers 12 and the photoelectric conversion elements 13. After that, in order to fill the apertures of the photoelectric conversion elements 13, the followings are respectively formed on the gate insulation film 14 in the boundaries between the photoelectric conversion elements 13: a conversion electrodes 15 which is made of conductive polycrystalline silicon; inter-layer insulation films 16 which electrically insulate these conversion electrodes 15 by covering them; and light-shielding films 17 which is made of tungsten.

(3) After the light-shielding films 17 are formed, a surface protection film 18 is formed on the surfaces of the gate insulation film 14 and the light-shielding films 17, the surface protection film 18 being, for example, a BPSG film (boron-phospho-silicate glass) or a SiON film obtained through a thermal flow process. At this time, a concave part is formed above each photoelectric conversion element 13 because of conversion electrodes 15 and the like.

(4) Further, after the wire (not shown) made of aluminium and the like is formed, for example, a SiON film and a bonding pad (not shown) for extracting electrodes are formed.

Figure 6:
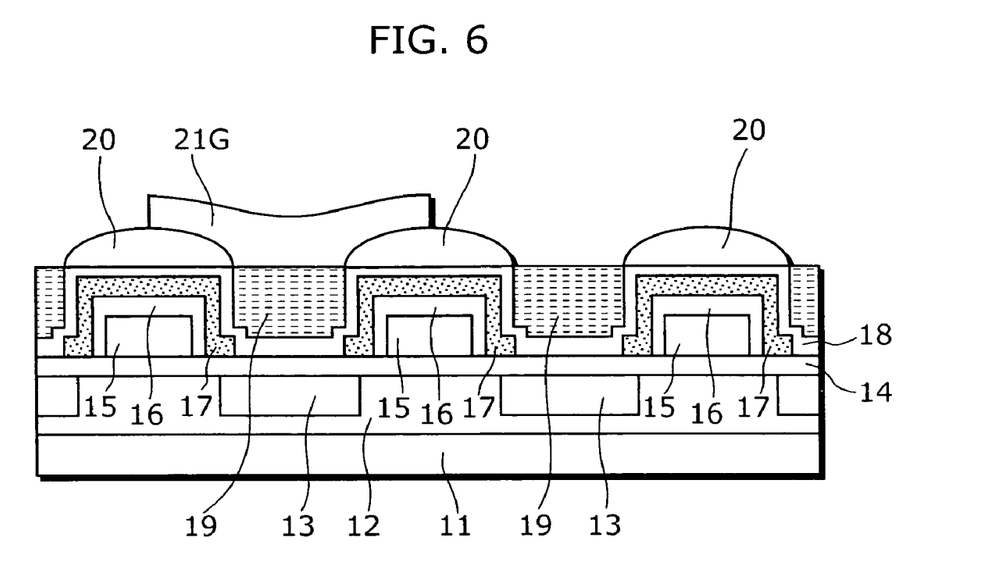
FIG. 6 is a sectional view of the solid-state imaging device of the present invention in its manufacturing process until a first color filter layer 21G for green is formed on the N-type semiconductor substrate 11.

FIG. 6 is a sectional view of the device in its manufacturing process during which up to first color filter layers G for green are formed. The manufacturing process performed until the sectional shape in the figure is obtained will be described in the following (5) to (8).

(5) First, as a preparation for forming the color filter layers 21 accurately later on, transparent planarization resin films 19 are formed in the concave parts above the photoelectric conversion elements 13 by performing the following processes: coating of a transparent photosensitive resin which is mainly made of, for example, a phenol resin, on the surface protection film 18; and performs the processes of exposure and development of the resulting resin surface.

(6) Next, one of the following is performed: coating of a thin film which is made of, for example, a transparent thermal curing type acrylic resin and performs thermal curing of the resulting resin layer; and vapor-coating of an HMDS film. After that, as a preparation for forming the color filter layers 21 accurately later on, for example, a negative type photosensitive resin is coated and the resulting resin layer is exposed and developed so as to form, in a frame form, resin parts 20 on the non-light-receiving area. Each of the resin parts 20 has an upward convex sectional shape and the width is equal to or smaller than the width of the light-shielding film 17. The non-light-receiving area is made of conversion electrode 15, a light-shielding film 17 and the like. In other words, each non-light-receiving area is between photoelectric conversion elements 13 which are adjacent to each other, and the position becomes a boundary of color filter layers 21 to be formed later on.

Note that the mask used at this time is a mask designed to be narrower than a light-shielding film 17, however, it is also possible to use a mask designed for a microlens 23 at the same time. Also, an example material used for this resin part 20 is as follows: a negative type photosensitive acrylic resin (transparent resin) obtained by removing a pigment component or a dye component of a color resist to be used later on; or a colored negative type photosensitive acrylic resin obtained by adding a black pigment or a black dye to the negative type photosensitive acrylic resin. Note that a transparent resin is used in this embodiment. Also, it is more effective that the refractive index of the resin part 20 is lowered than that of each color filter layer 21 to be formed later on.

(7) After the resin parts 20 are formed, one of the followings is further performed: coating of a thin film made of a transparent thermal curing type acrylic resin or the like and performing a thermal curing process of the resulting thin film; and vapor-coating of an HMDS film and then, for example, a resist for forming a color filter layer 21G for green in sequence. This resist is prepared to contain a pigment or a dye which allows only green wavelength light to pass itself through.

(8) Sequentially, the resin-coated color resist is exposed and developed using a photomask designed for forming a green color filter layer 21G on each desired photoelectric conversion element 13. By performing the above-described processes, a green color filter layer 21G whose sectional shape becomes a concave lens is formed. Note that, in the case where a dye-containing type color resist is used as a color filter layer material, performing the PEB process after exposure makes it possible to improve the stability as a color filter material and the sectional shape.

FIG. 4 shows a sectional view of the device in its manufacturing processes starting with the formation of the green color filter layer 21 and ends with the formation of the microlens 23. The manufacturing processes performed until the sectional shape shown in the figure is obtained will be described in the following (9) to (12).

(9) After a green color filter layer 21G is formed, a blue color filter layer 21B and a red color filter layer 21R are formed, a blue color filter layer 21B and a red color filter layer 21R are respectively formed at determined positions in the same way used for a green color filter layer 21G.

(10) Further, in order to form on-chip microlens 23 to be formed accurately later on, a second transparent planarization film 22, which is for planarizing the surface realized after the color filter layer 21 is formed, is formed by repeating the following processes: coating a transparent thermal curing resin which is mainly made of, for example, an acrylic resin on each of the color filter layers 21G, 21B and 21R several times, and then performing a bake process for causing thermal curing of the resin.

(11) After that, in order to shorten the distance from a light receiving surface to each of the color filter layers 21G, 21B and 21R with a purpose of improving the sensitivity of each filter, etching of the second transparent planarization film 22 is performed as deep as possible according to a well-known etch back method.

(12) After that, an on-chip micro lens 23 having an upward convex shape is formed through the following processes: coating of a transparent positive type photosensitive resin which is mainly made of a phenol resin on the surface of the second transparent planarization film 22 above each photoelectric conversion element 13; exposure of the resin; and development (including breeching and baking) of the exposed resin. The spectral transmittance of each on-chip microlens 23 is improved by the irradiation of ultra violet rays. Note that the post-bake temperature of the microlens 23 needs to be adjusted to 200 degrees or below in order to prevent the deterioration of the spectral characteristics of the color filter layers 21G, 21B and 21R. Also, it is required that: the refractive index of the first transparent planarization film 19 is lower than that of the color filter layer 21; the refractive index of the second transparent planarization film 22 is lower than those of the color filter layers 21G, 21B and 21R; and the refractive index of each on-chip microlens 23 is higher than that of the second transparent planarization film 22.

The solid-state imaging device 1 shown in FIG. 4 can be manufactured by performing the above-described processes.

With each resin part 20, it becomes possible to expect that the effect of a concave lens is obtained because color filter layers 21G, 21B and 21R to be formed later on can be slimed down in each boundary than in the part above each photoelectric conversion element 13. Therefore, the light condensing rate of each filter is increased, and thus its sensitivity is improved.

Further, it becomes possible to form color filter layers 21G, 21B and 21R accurately. Also, when oblique incident light reaches the surface, it is possible to prevent color mixture between adjacent elements, the color mixture occurring depending on dimensional accuracy. This makes it possible to improve the problem of nonuniform tone of lines, sensitivity variations and color shading.

As described up to this point, the solid-state imaging device in this embodiment of the present invention makes it possible to form color filter layers 21 having an improved sectional shape and an excellent dimensional accuracy by means of: forming of resin parts at each boundary between adjacent color filter layers 21 which will be formed later on, the resin parts having an upward convex section which is vertical to the boundaries; and then forming of the respective color filter layers 21 in order to cover the resin parts.

Consequently, it becomes possible to prevent color mixture from adjacent color filter layers 21 because of oblique light, and thus the solid-state imaging device can realize high-definition images.

Further, making the refractive indexes of the resin parts 20 formed at each boundary lower than those of the color filter layers 21 provides the effect of reducing the incident light coming from adjacent pixels.

Also, these color filter layers 21 have a concave lens shape and the refractive index which is higher than that of the second planarization film. This makes it possible to condense incident light on each photoelectric conversion element 13 efficiently, and thus it becomes possible to improve its sensitivity.

Further, since color filter layers 21 can be slimmed down in the peripheral parts, it becomes possible to accurately form the respective color filter layers 21 on photoelectric conversion elements 13. This results in eliminating color-shading between pixels, and consequently, the solid-state imaging device can improve the problems of nonuniform tone of lines and color shading.

Also, since spectral dispersion of these color filter layers 21 is lower in their peripheral parts than in their center parts, light transmission from the peripheral parts of these color filter layers 21 increases compared to the case of a conventional structure. Consequently, the solid-state imaging device can have an improved sensitivity.

Further, the refractive indexes of on-chip microlenses 23 formed on the second transparent planarization films 22 are higher than those of the second planarization films, it becomes possible to efficiently condense incident light that reaches the microlenses 23 on the photoelectric conversion elements 13. Consequently, the sensitivity of the device is improved.

Note that methods for forming transparent planarization resin films 19 below these color filter layers 21 include: (a) a method for coating a transparent photosensitive film, and performing exposure and development processes so as to fill the concave parts in the ground layer; (b) a method for coating a transparent film several times and performing planarization according to a well-known etch back method; (c) a method for coating a transparent film and performing planarization through a thermal flow process; and (d) a combination method of the above-listed methods for improving planarization level.

A resin part 20 can be obtained in the following way: coating of a black pigment dispersion type color resist or a black dye-containing type color resist; and then performing of exposure and development processes using a mask for forming a microlens 23 or a photomask designed to be smaller than the light-shielding area.

This manufacturing method enables to manufacture the solid-state imaging device having the structure, action and effect that are described above.

The solid-state imaging device and the manufacturing method of the solid-state imaging device in the embodiment of the present invention have been described up to this point. However, this invention is not limited to the embodiment, in other words, variations can be applied without deviating from the scope of the present invention.

For example, there has been described a method of employing primal colors for color filter layers 21, the primary colors are used for realizing a tone-oriented solid-state imaging device. However, a method of employing complementary colors may be applied in the case where a desired solid-state imaging device is a resolution and sensitivity oriented one. In the latter case, color filters for mazenta, yellow and cyan are formed at predetermined positions according to a well-known color alignment so as to form color filter layers.

Also, materials for forming such color resist layers include a color resist containing a dye, a color resist containing a pigment and the like, and any one of them can be selected.

Also, there has been described a well-known photolithographic technique according to which a first transparent planarization film 19 is made of a transparent photosensitive resin. However, there is a formation method, according to a well-known etch back method, of repeating the processes of: coating a transparent thermal curing resin material several times; and then performing thermal curing of the resin.

After the first transparent planarization film 19 is formed, a transparent thermal curing type resin which is mainly made of acrylic resin or an HMDS film is used for improving adhesion between a resin part 20 and a color filter layer 21. However, they can be omitted as long as the adhesion strength is guaranteed.

Also, the solid-state imaging device described in the embodiment is CCD type. However, the type is not limited to CCD type, in other words, an amplifier type solid-state imaging device such as MOS type or another type solid-state imaging device can also be applied.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention is suitable for a solid-state imaging device including: photoelectric conversion elements 13 which are formed on a semiconductor substrate 11; conversion electrodes 16 which are formed around these photoelectric conversion elements 13; color filter layers 21 which are formed on these photoelectric conversion elements 13; and microlenses 23 formed on these color filter layers 21.

What is claimed is:

1. A solid-state imaging device in which pixels are arranged in a matrix shape above a semiconductor substrate, each of the pixels having a photoelectric conversion element and a color filter layer which is formed above the photoelectric conversion element, and said device comprising
   resin parts formed above boundary parts between photoelectric conversion elements which are adjacent to each other so that each of the resin parts constitutes an upward convex part,
   wherein each of the color filter layers is formed so as to cover an area ranging from a summit of a respective one of the resin parts to a summit of an adjacent one of the resin parts,
   each of the color filter layers is formed so as to be thinner in a peripheral part than in a center part, and
   each of the resin parts is formed to have a width smaller than a width of a corresponding one of the boundary parts.

2. The solid-state imaging device according to claim 1, wherein each of the color filter layers is made of a dye-containing type color resist.

3. The solid-state imaging device according to claim 1, wherein said resin parts are formed in a lattice shape above the boundary parts between photoelectric conversion elements which are adjacent to each other, and
   each of the color filter layers functions as a concave lens.

4. The solid-state imaging device according to claim 1, wherein each of the resin parts is made of a material having a refractive index which is lower than a refractive index of each of the color filter layers.

5. A solid-state imaging device in which pixels are arranged in a matrix shape above a semiconductor substrate, each of the pixels having a photoelectric conversion element and a color filter layer which is formed above the photoelectric conversion element, and said device comprising:
   resin parts formed above boundary parts between photoelectric conversion elements which are adjacent to each other so that each of the resin parts constitutes an upward convex part; and
   first transparent planarization films which are formed between each of the photoelectric conversion elements and a corresponding one of the color filter layers so that the surfaces of the first transparent planarization films become flush with the surfaces of the boundary parts,
   wherein each of the color filter layers is formed so as to cover an area ranging from a summit of a respective one of the resin parts to a summit of an adjacent one of the resin parts, each of the color filter layers is formed so as to be thinner in a peripheral part than in a center part, and each of the color filter layers is made of a material having a refractive index which is higher than a refractive index of each of the first transparent planarization films.

6. A solid-state imaging device in which pixels are arranged in a matrix shape above a semiconductor substrate, each of the pixels having a photoelectric conversion element and a color filter layer which is formed above the photoelectric conversion element, and said device comprising:

resin parts formed above boundary parts between photoelectric conversion elements which are adjacent to each other so that each of the resin parts constitutes an upward convex part; and second transparent planarization films which are formed on the color filter layers, wherein each of the color filter layers is formed so as to cover an area ranging from a summit of a respective one of the resin parts to a summit of an adjacent one of the resin parts, each of the color filter layers is formed so as to be thinner in a peripheral part than in a center part, each of the resin parts is made of a material having a refractive index which is lower than a refractive index of each of the color filter layers, and each of the second transparent planarization films is made of a material having a refractive index which is lower than the refractive index of each of the color filter layers.

7. The solid-state imaging device according to claim 6, further comprising microlenses which are formed on said second transparent planarization films, wherein each of the microlenses is made of a material having a refractive index which is higher than the refractive index of each of the second transparent planarization films.

8. The solid-state imaging device according to claim 7, wherein each of the microlenses is made of a material having a refractive index which is higher than the refractive index of each of the color filter layers.

9. A manufacturing method of a solid-state imaging device in which pixels are arranged in a matrix shape above a semiconductor substrate, each of the pixels having a photoelectric conversion element and a color filter layer which is formed above the photoelectric conversion element, and said method comprising:

forming resin parts above boundary parts between photoelectric conversion elements which are adjacent to each other so that each of the resin parts constitutes an upward convex part, and so that each of the resin parts has a width smaller than a width of a corresponding one of the boundary parts; and forming each of the color filter layers so as to cover an area ranging from a summit of a respective one of the resin parts to a summit of an adjacent of the resin parts, and so that each of the color filter layers is thinner in a peripheral part than in a center part.

10. The manufacturing method of a solid-state imaging device according to claim 9, said method further comprising forming microlenses on the color filter layers, wherein, in said forming of the resin parts, the resin parts are formed using a mask for forming the microlenses.

11. The manufacturing method of a solid-state imaging device according to claim 10, wherein the resin parts are made of a negative type resist, and the microlenses are made of a positive type resist.

12. The manufacturing method of a solid-state imaging device according to claim 9, further comprising forming first transparent planarization films on the photoelectric conversion elements so that the surfaces of the first transparent planarization films become flush with the surfaces of the boundary parts, said forming of the first transparent planarization films being performed before said forming of the resin parts.

13. The manufacturing method of the solid-state imaging device according to claim 9, wherein the resin parts are made of colored resin.

14. The solid-state imaging device according to claim 1, wherein the resin parts are made of colored resin.

* * * * *